United States Patent [19]
Jelinek

[11] 3,961,285
[45] June 1, 1976

[54] VOLTAGE CONTROLLED OSCILLATOR DRIVER

[75] Inventor: Ronald H. Jelinek, Pine Brook, N.J.

[73] Assignee: International Telephone and Telegraph Corporation, Nutley, N.J.

[22] Filed: Sept. 23, 1971

[21] Appl. No.: 183,121

[52] U.S. Cl. ............................. 332/16 T; 332/9 T
[51] Int. Cl.² ......................................... H03C 3/00
[58] Field of Search ............... 332/9, 9 T, 16, 16 T, 332/18, 19; 325/30, 148, 163, 452, 453, 457, 467, 468, 469; 331/18, 23, 25

[56] References Cited
UNITED STATES PATENTS

| | | | |
|---|---|---|---|
| 2,672,589 | 3/1954 | McLeod | 332/18 |
| 2,947,860 | 8/1960 | Alvernaz | 325/453 X |
| 2,968,769 | 1/1961 | Johnson et al. | 332/19 X |
| 3,249,876 | 5/1966 | Harrison | 325/453 |
| 3,337,814 | 8/1967 | Brase et al. | 331/18 |

*Primary Examiner*—Nelson Moskowitz
*Attorney, Agent, or Firm*—John T. O'Halloran; Menotti J. Lombardi, Jr.; Vincent Ingrassia

[57] ABSTRACT

This invention relates to a circuit for switching a voltage controlled RF oscillator between two preset variable frequencies and simultaneously imposing frequency modulation about the selected center frequency. A frequency modulation signal is fed to a stabilized amplifier chain consisting of a low level amplifier, a high level amplifier and a feedback network. A switching network allows the output of the feedback network to be changed as a function of the frequency selection input. An isolated input is provided for the injection of frequency modulation.

3 Claims, 3 Drawing Figures

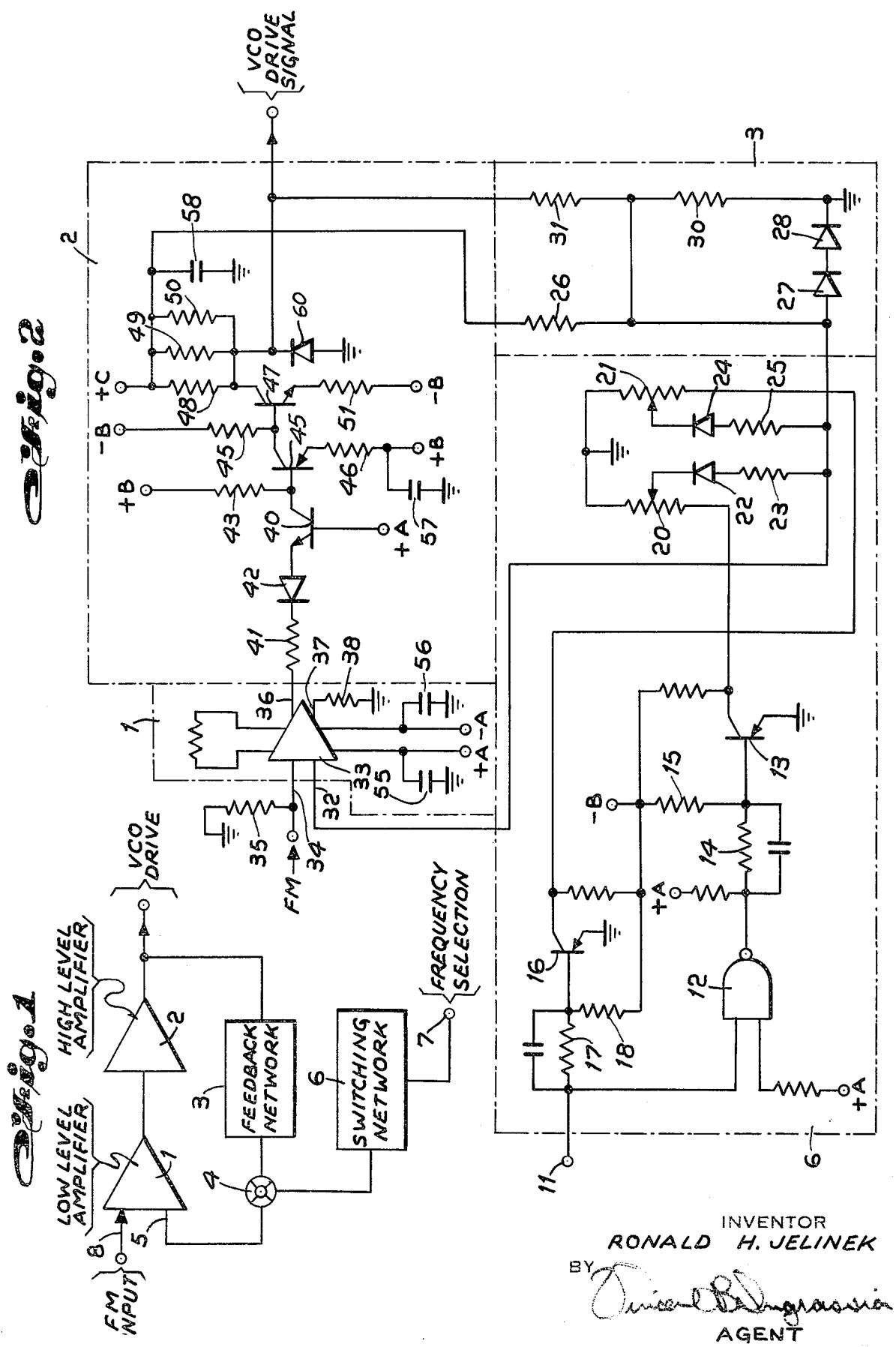

VOLTAGE CONTROLLED OSCILLATOR DRIVER

BACKGROUND OF THE INVENTION

This invention relates to a circuit for driving a voltage controlled oscillator (VCO), and more particularly to a circuit for switching a VCO between two preset variable frequencies and simultaneously imposing frequency modulation about the selected center frequency. When it is desired that the VCO generate a single preselected frequency, it is a simple matter to control the output of the voltage controlled oscillator by means of a feedback path which senses the VCO output, determines the frequency difference between the VCO output and the desired VCO output and generates therefrom a controlling DC voltage for changing the output frequency of the VCO. However, no known circuit exists which will switch a voltage controlled RF oscillator between two preset variable frequencies and simultaneously impose frequency modulation about the selected center frequency.

SUMMARY OF THE INVENTION

It is an object of the present invention to provide a VCO driver for switching a voltage controlled RF oscillator between two preset variable frequencies and simultaneously imposing frequency modulation about the selected center frequency.

Requirements such as bandwidth of the superimposed FM, center frequency band limits, switching time between said center frequencies and environmental limits can be satisfied by the proper selection of various components which form the VCO driver circuitry. It should not be inferred that any change in voltage, component type or value, or number of frequencies selected negates the conception of a circuit for achieving the above object.

According to a broad aspect of the invention there is provided a circuit for driving a voltage controlled oscillator which is to be switched between two preset variable frequencies and for simultaneously imposing frequency modulation about a selected center frequency comprising amplifying means having two inputs, one of said inputs being connected to a frequency modulating signal and having an output for driving a voltage controlled oscillator, a feedback circuit having an input coupled to the output of said amplifying means, said feedback circuit for generating a controlling DC voltage which is applied to the other input of said amplifying means, and means for changing the output of said feedback network as a function of frequency.

The above and other objects of the present invention will be more clearly understood from the following detailed description taken in conjunction with the accompanying drawings in which:

BRIEF DESCRIPTION OF THE DRAWINGS

FIG. 1 is a block diagram of the inventive VCO driver;

FIG. 2 is a circuit diagram showing the components which make up the blocks in FIG. 1.

DESCRIPTION OF THE PREFERRED EMBODIMENT

Figure 3:
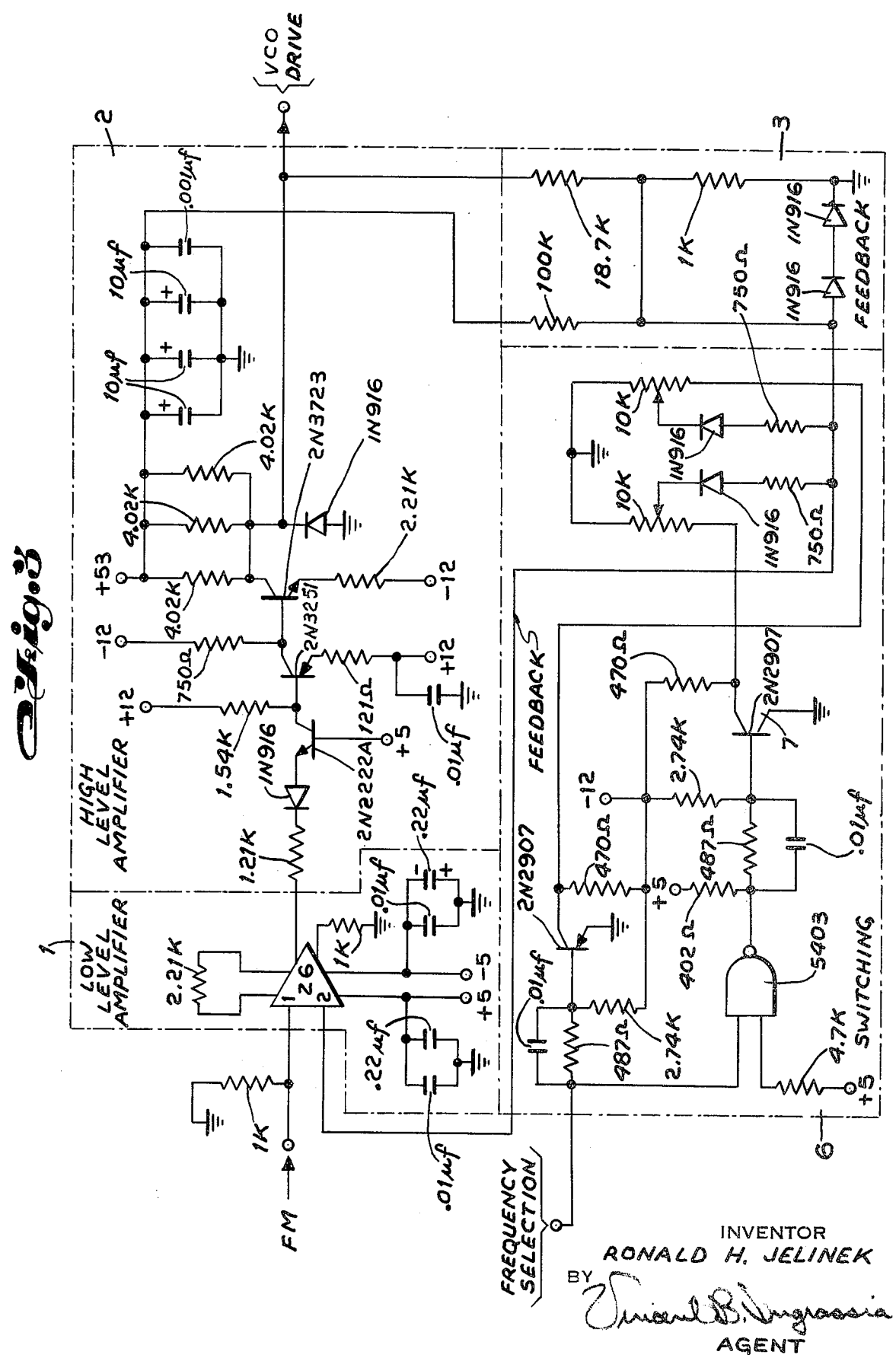
FIG. 3 shows a practical implementation of the circuit of FIG. 2 showing component values.

The block diagram of FIG. 1 shows a stabilized amplifier chain consisting of low level amplifier 1, high level amplifier 2 and feedback network 3. The output of feedback network 3 is fed to a combining point 4, the output of which is fed to terminal 5 of low level amplifier 1. The output of switching network 6 is also fed to combining point 4 and allows the output level of said feedback network 3 to be changed as a function of the activity on frequency selection terminal 7. Isolated input 8 to low level amplifier 1 provides for the injection of frequency modulation from a frequency modulation generator, not shown, and not considered a part of this invention. The VCO drive signal appears at the output of high level amplifier 2 and acts as a controlling signal to a voltage controlled oscillator also not shown and not considered a part of this invention.

FIG. 2 shows a detailed schematic of the arrangement shown in FIG. 1. The dotted lines in FIG. 2 represent the blocks of FIG. 1 and are denoted by like reference numerals.

Frequency selection is accomplished by imposing a logical 1 or 0 on input 11. With the assumption that a logical 1 (1 = 5 volts, 0 = 0 volts) appears at input 11, NAND gate 12 will be in its ON state and its output will be logical 0. Transistor 13 will be biased ON by the voltage divider consisting of resistors 14 and 15 to −12 volts. Concurrently transistor 16 will be biased OFF by the logical 1 across resistors 17 and 18. In this condition, there will be approximately −12 volts across variable resistor 20 and 0 volts across variable resistor 21. The center tap of resistor 20 may be adjusted to set the level of the feedback voltage through diode 22 and resistor 23. A similar action occurs when the frequency selection control voltage on input terminal 11 changes to a logical 0 except that the feedback level is set by variable resistor 21, diode 24 and resistor 25. Resistor 26 is included to provide forward bias current for diodes 27 and 28. Diodes 27 and 28 prevent the feedback level from exceeding a predetermined value, typically 1.4 volts. It is the adjusting of the center taps of variable resistors 20 and 21 which determine the two present frequencies between which the VCO will be switched.

A fraction of the VCO drive voltage is sampled by resistors 30 and 31 and added to the feedback level determined by the setting of resistor 20 or resistor 21. This stabilizes the closed loop and compensates for drift in high level amplifier 2. The feedback voltage is fed into input 32 of high level (high gain wide band-switch) amplifier 33 which is a standard component such as a Fairchild MA 733. The frequency modulating signal is fed to input 34 of amplifier 33 across resistor 35. The output 36 of amplifier 33 is a constant gain (typically 30) times the signal on input 34 minus the signal on input 32. A complementary output appears at output 37 across resistor 38. A level shifter comprising transistor 40, resistor 41, diode 42 and resistor 43 provides a DC level shift at approximately unity gain. Transistor 44, resistor 45 and resistor 46 provide inversion and a gain of six. Transistor 47 and resistors 48, 49, 50 and 51 provide a second inversion and a gain of approximately 7. The forward gain ($G_f$) of the combined low level and high level amplifier chain is therefore approximately 1300.

The overall closed loop gain ($G_c$) is given by:

$$G_c = \frac{G_f}{1 + G_f H}$$

where H is the feedback ratio formed by resistors 30 and 31. Since $G_f$ is much greater than 1, $G_c$ can be written as:

$$G_c = \frac{1}{H} = \frac{R_{30} + R_{31}}{R_{30}} = 20.$$

Capacitors 55, 56, 57 and 58 are bypass capacitors and diode 60 is provided to prevent the output voltage from swinging negative, which could cause damage to the particular VCO used.

FIG. 3 shows a practical realization of the circuit shown in FIG. 2 with component values given.

This circuit can be used as presented or modified as necessary to drive any voltage controlled device where the output is to be preset, adjustable, switchable or modulated. Voltage levels, speed, bandwidth and power may indicate that certain components be replaced with other bi-polar or MOS devices. integrated circuits or vacuum tubes. Such interchange does not violate the basic concepts.

It is to be understood that the foregoing description of specific examples of this invention is made by way of example only and is not to be considered as a limitation on its scope.

I claim:

1. A circuit for driving a voltage controlled oscillator which is to be switched between two preset variable frequencies and for simultaneously imposing frequency modulation about a selected center frequency comprising:

low level amplifying means having two inputs, one of said inputs being connected to a frequency modulating signal and having an output for driving a voltage controlled oscillator;

high level amplifying means having an input coupled to the output of said low level amplifying means;

a feedback circuit having an input coupled to the output of said high level amplifying means, said feedback circuit for generating a controlling DC voltage which is applied to the other input of said low level amplifying means; and means for changing the output of said feedback network as a function of frequency.

2. A circuit according to claim 1, wherein said means for changing the output of said feedback network comprises a switching network having at least one frequency selection terminal, said switching network having an output coupled to the output of said feedback circuit for changing the output level of said feedback circuit as a function of activity on said frequency selection terminal.

3. A circuit according to claim 2, wherein said switching network includes means for varying said two preset frequencies.

* * * * *